United States Patent
Chae et al.

(10) Patent No.: US 6,992,949 B2
(45) Date of Patent: Jan. 31, 2006

(54) METHOD AND CIRCUIT FOR CONTROLLING GENERATION OF COLUMN SELECTION LINE SIGNAL

(75) Inventors: Moo-sung Chae, Seoul (KR); Hyung-chan Choi, Suwon-si (KR)

(73) Assignee: Samsung Electronics, Co., Ltd., (KR)

( * ) Notice: Subject to any disclaimer, the term of this patent is extended or adjusted under 35 U.S.C. 154(b) by 0 days.

(21) Appl. No.: 10/941,446

(22) Filed: Sep. 15, 2004

(65) Prior Publication Data

US 2005/0078545 A1    Apr. 14, 2005

(30) Foreign Application Priority Data

Sep. 30, 2003  (KR) ............... 10-2003-0067913

(51) Int. Cl.
*G11C 8/00* (2006.01)
(52) U.S. Cl. ............ 365/230.06; 365/201; 365/233
(58) Field of Classification Search ........... 365/230.06, 365/201, 233
See application file for complete search history.

(56) References Cited

U.S. PATENT DOCUMENTS

| | | | | |
|---|---|---|---|---|
| 4,055,754 A | * | 10/1977 | Chesley ............... | 365/201 |
| 5,424,990 A | * | 6/1995 | Ohsawa ............... | 365/201 |
| 5,652,725 A | * | 7/1997 | Suma et al. ......... | 365/201 |
| 6,529,438 B1 | * | 3/2003 | Suzuki et al. ....... | 365/230.06 |
| 6,697,292 B1 | * | 2/2004 | Fukuda ............... | 365/201 |

\* cited by examiner

*Primary Examiner*—Trong Phan
(74) *Attorney, Agent, or Firm*—Mills and Onello, LLP

(57) ABSTRACT

There are provided a method and circuit for controlling generation of a column selection line signal. The method includes determining whether a current mode is a normal operation mode or a test operation mode; receiving an activated test operation mode signal and an activated first clock signal and outputting a column selection line signal with an activation time proportional to an activation time of the first clock signal, when the current mode is the test operation mode; and outputting the column selection line signal that is activated in response to the activated first clock signal and is deactivated in response to an activated second clock signal, when the current mode is the normal operation mode. An activation time of the first clock signal is proportional to that of an external clock signal. In the test operation mode, a command is performed during one period of the external clock signal. A column selection line signal can be generated without an increase in circuit logic, depending on a type of operation mode. Accordingly, it is possible to effectively realize CCD=1tCK in a semiconductor memory device, which operates in the DDR2 mode, in a test operation mode.

22 Claims, 4 Drawing Sheets

METHOD AND CIRCUIT FOR CONTROLLING GENERATION OF COLUMN SELECTION LINE SIGNAL

BACKGROUND OF THE INVENTION

This application claims the benefit of Korean Patent Application No. 2003-67913 filed on Sep. 30, 2003, in the Korean Intellectual Property Office, the contents of which are incorporated herein in their entirety by reference.

1. Field of the Invention

The present invention relates to a semiconductor memory device, and more particularly, to a method and circuit for controlling an activation time of a column selection line signal that depends on a type of operation mode.

2. Description of the Related Art

To increase operating speed of a semiconductor memory device, operating speed of a Central Processing Unit (CPU) must be increased and the CPU should operate without a standby time, thus minimizing time required to access memory.

These requirements have resulted in development of Synchronous Dynamic Random Access Memory (SDRAM) in which memory access is made in synchronization with a system clock, thus remarkably shortening memory access time.

In general, the SDRAM operates in response to a pulse signal. The pulse signal is generated in a Single Data Rate (SDR) mode or a Double Data Rate (DDR) mode, using transitions of the system clock.

In the SDR mode, a pulse signal is generated at a rising edge or a falling edge of the system clock. In the DDR mode, a pulse signal is generated at both the rising edge and falling edge of the system clock.

The DDR mode can be classified as a DDR1 mode or a DDR2 mode. In the DDR1 mode, two items of data are read during a clock period and the two read data items are output during a clock period.

In the DDR2 mode, four items of data are read during a clock period and the four read data items are output over two clock periods. The DDR2 mode is referred to as a 4-bit prefetch mode.

Since read data is output over two clock periods in the DDR2 mode, a Column Address Strobe (CAS)-to-CAS Delay (CCD) of the DDR2 mode is prescribed to be twice the clock period, i.e., 2tCK, in the Joint Electron Device Engineering Council (JEDEC) specification.

Here, CCD denotes a time interval between two received commands. CCD=2tCK denotes that a subsequent command can only be received two clock periods after receipt of a current command, e.g., a read command.

A semiconductor memory device that operates in the DDR2 mode operates in the SDR mode in a test operation mode. In this case, CCD is preferably readjusted to 1tCK so as to reduce test time.

FIG. 1 is a timing diagram illustrating a conventional method of controlling generation of a column selection line signal CSL in the DDR2 mode. Referring to FIG. 1, a read command RC is received in response to a rising edge of an external clock signal ECLK, and a next read command RC is received in response to a rising edge of the external clock signal ECLK after two clock periods. That is, CCD=2tCK.

A first clock signal PCSLEB is activated (1) in response to at a rising edge of the external clock signal ECLK. The first clock signal PCSLEB is activated at a logic low level and becomes deactivated after a predetermined period.

The column selection line signal CSL is activated (2) at a logic high level in response to the activation of the first clock signal PCSLEB. Then, a second clock signal PCSLDB is activated (3) in response to a next rising edge of the external clock signal ECLK. The second clock signal PCSLDB is also activated at a logic low level and becomes deactivated after a predetermined period. The column selection line signal CSL is deactivated (4) in response to the activation of the second clock signal PCSLDB.

That is in the DDR2 mode, the column selection line signal CSL is activated in response to the activation of the first clock signal PCSLEB and is deactivated in response to the activation of the second clock signal PCSLDB. However, in the test mode that is the SDR mode, the read command RC is received over a period of the external clock signal ECLK, and therefore, an activation time of the column selection line signal CSL must be adjusted.

FIG. 2 is a timing diagram illustrating a conventional method of controlling generation of a column selection line signal CSL in the test operation mode. Referring to FIG. 2, a read command RC is received at a rising edge of an external clock signal ECLK and a next read command RC is received at a rising edge of the external clock signal ECLK after a clock period. That is, CCD=1tCK in the test operation mode.

A first clock signal PCSLEB is activated (1) in response to a rising edge of the external clock signal ECLK. The first clock signal PCSLEB is activated at a logic low level and becomes deactivated after a predetermined period. The column selection line signal CSL is activated (2) at a logic high level in response to the activation of the first clock signal PCSLEB.

A second clock signal PCSLDB is activated (3) in response to a next rising edge of the external clock signal ECLK. The second clock signal PCSLDB is activated (3) a shorter period after the activation of the first clock signal PCSLEB than the second clock signal PCSLDB of FIG. 1.

The second clock signal PCSLDB becomes deactivated after a predetermined period. The column selection line signal CSL is deactivated (5) when the second clock signal PCSLDB is activated.

The first clock signal PCSLEB is activated in response to the rising edge of the external clock signal ECLK that activates the second clock signal PCSLDB (4).

The activation of the second clock signal PCSLDB is accelerated for fast deactivation of the column selection line signal CSL in FIG. 2. To accelerate the activation of the second clock signal PCSLDB, control logic for controlling the second clock signal PCSLDB is required in the test operation mode.

FIG. 3 is a timing diagram illustrating another conventional method of controlling generation of a column selection line signal CSL in the test operation mode. Referring to FIG. 3, a read command RC is received at a rising edge of an external clock signal ECLK and a next read command RC is received at a rising edge of the external clock signal ECLK after a clock period. That is, CCD=1tCK in the test operation mode.

A first clock signal PCSLEB is activated (1) at a logic low level in response to a rising edge of an external clock signal ECLK and becomes deactivated at a logic high level after a predetermined time. The column selection line signal CSL is activated at a logic high level in response to the activation of the first clock signal at the low level.

A second clock signal PCSLDB is activated (3) in response to a falling edge of the external clock signal ECLK. The second clock signal PCSLDB is activated a shorter period after the activation of the first clock signal PCSLEB than the second clock signal PCSLDB of FIG. 1.

The second clock signal PCSLDB activated at the low level becomes deactivated after a predetermined time. The column selection line signal CSL is deactivated in response to the activation of the second clock signal PCSLDB.

The first clock signal PCSLEB is activated (5) at a next rising edge of the next external clock signal ECLK.

An additional buffer is required to activate (6) the second clock signal PCSLDB at a falling edge of the external clock signal ECLK as shown in FIG. 3. However, inclusion of the buffer increases the size of a semiconductor memory device, thus increasing power consumption.

Also, when the time when the second clock signal PCSLDB is activated is adjusted as shown in FIG. 2, the instants in time at which the second clock signal PCSLDB is activated become largely different in the DDR2 mode, which is a normal operation mode, and the test operation mode, thus causing an inconsistency in the activation of the second clock signal PCSLDB.

SUMMARY OF THE INVENTION

The present invention provides a method of controlling generation of a column selection line signal that depends on a type of operation mode.

The present invention also provides a circuit for controlling generation of a column selection line signal that depends on a type of operation mode.

According to one aspect of the present invention, there is provided a method of controlling a column selection line signal, the method comprising determining whether a current mode is a normal operation mode or a test operation mode; receiving an activated test operation mode signal and an activated first clock signal and outputting a column selection line signal with an activation time proportional to an activation time of the first clock signal, when the current mode is the test operation mode; and outputting the column selection line signal that is activated in response to the activated first clock signal and is deactivated in response to an activated second clock signal, when the current mode is the normal operation mode.

Outputting the column selection line signal with an activation time proportional to the activation time of the first clock signal can comprise activating the column selection line signal when the first clock signal is activated, and deactivating the column selection line signal when the first clock signal is deactivated.

The activation time of the first clock signal can be proportional to an activation time of an external clock signal. The first clock signal can be activated in response to activation of the external clock signal and deactivated in response to deactivation of the external clock signal.

In one embodiment, a command is performed for one period of the external clock signal in the test operation mode. The test operation mode signal can be activated in the test operation mode and deactivated in the normal operation mode. The test operation mode signal can be a mode register set signal.

The second clock signal can be activated in response to the activation of the external clock signal and deactivated in response to the activation of the subsequent external clock signal. A command can be performed for two periods of the external clock signal in the normal operation mode.

According to another aspect of the present invention, there is provided a column selection line signal control circuit comprising a first controller that inverts a first clock signal and outputs a first control signal as a result of inversion of the first clock signal; a second controller that outputs a test operation mode signal as a second control signal in a test operation mode, and inverts a second clock signal and outputs the second control signal as a result of inversion of the second clock signal in a normal operation mode; and a column selection line signal generator that receives the first and second control signals and outputs a column selection line signal, which, in the test operation mode, has an activation time proportional to activation time of the first control signal, and, in the normal operation mode, is activated in response to activation of the first control signal and deactivated in response to activation of the second control signal.

In one embodiment, the activation time of the first clock signal is proportional to an activation time of the external clock signal.

In one embodiment, the first clock signal is activated in response to activation of the external clock signal and deactivated in response to deactivation of the external clock signal. A command is performed for one period of the external clock signal in the test operation mode.

In one embodiment, the first controller comprises: a first inverter that inverts the first clock signal; a first NAND gate that performs a NAND operation on an output of the first inverter and a first column address signal; and a second inverter that inverts an output of the first NAND gate and outputs the first control signal as a result of inversion of the output of the first NAND gate. The first clock signal can be activated at a second logic level and deactivated at a first logic level.

In one embodiment, the test operation mode signal is activated in the test operation mode and deactivated in the normal operation mode.

The test operation mode signal can be a mode register set signal.

The second clock signal can be activated in response to the activation of the external clock signal and deactivated in response to the activation of the subsequent external clock signal. A command can be performed for two periods of the external clock signal in the normal operation mode. The second clock signal can be activated at a second logic level and deactivated at a first logic level.

In one embodiment, the second controller comprises: a third inverter that inverts the second clock signal and outputs as a result of inversion of the second clock signal; a NOR gate that performs a NOR operation on an output of the third inverter and the test operation mode signal; and a fourth inverter that inverts an output of the NOR gate and outputs the second control signal as a result of inversion of the output of the NOR gate.

In one embodiment, the column selection line signal generator comprises: a second NAND gate that performs a NAND operation on a second column address signal and the second control signal; a first transistor having a first terminal connected to a power source voltage, a gate to which an output of the second NAND gate is input, and a second terminal connected to a first node; a second transistor having a first terminal connected to the first node and a gate to which the second control signal is input; a third transistor having a first terminal connected to the second terminal of the second transistor, a gate to which the output of the second NAND gate is input, and a second terminal connected to a ground voltage; a latch that receives and latches a logic value from the first node; and a fifth inverter that inverts an output of the latch and outputs the column selection line signal as a result of inversion of the output of the latch.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
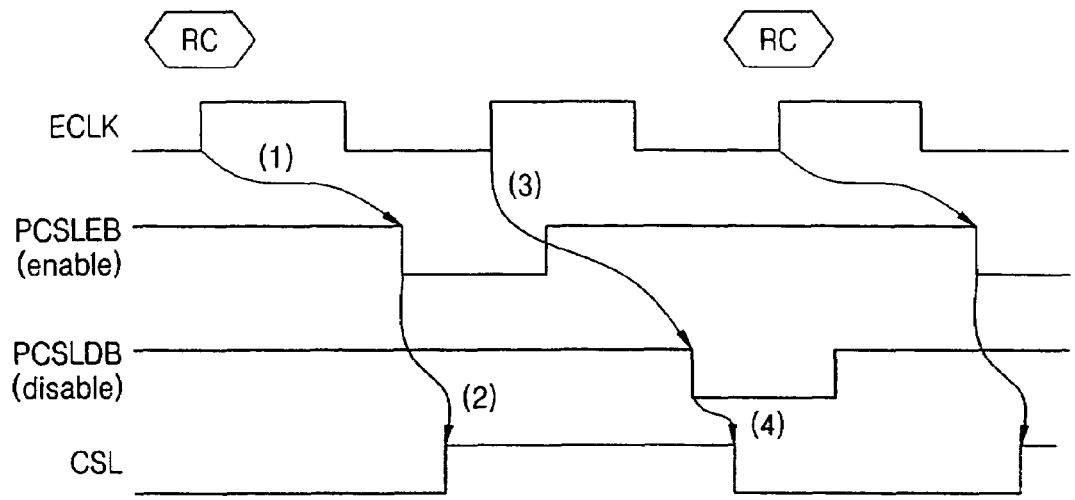
FIG. 1 is a timing diagram illustrating a conventional method of controlling generation of a column selection line signal in a Double Data Rate (DDR) 2 mode.
Figure 2:
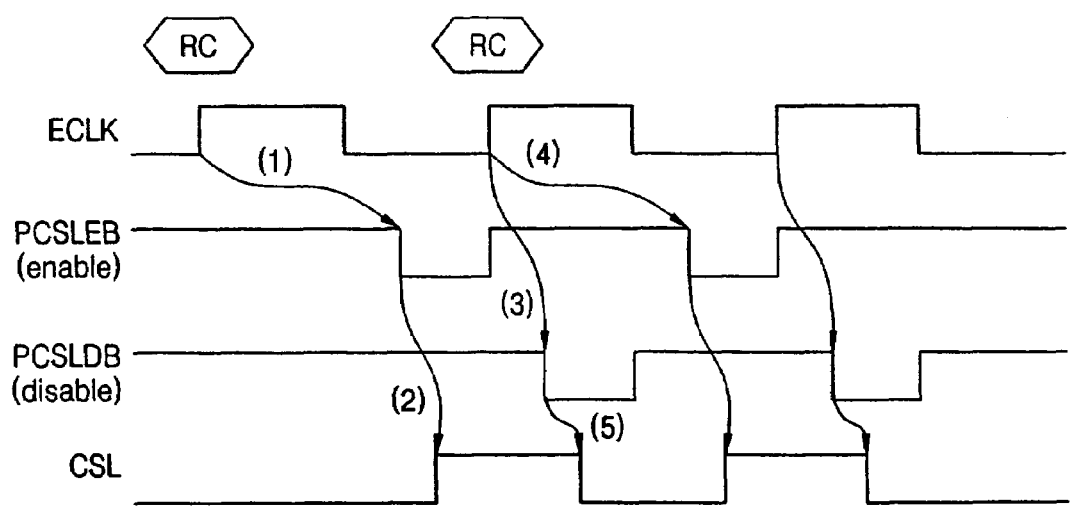
FIG. 2 is a timing diagram illustrating a conventional method of controlling generation of a column selection line signal in a test operation mode.
Figure 3:
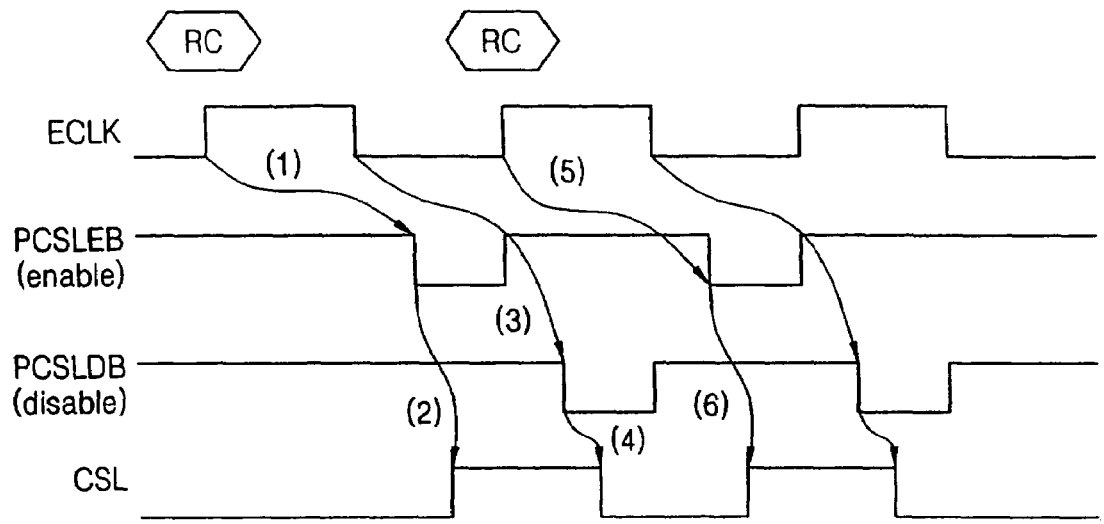
FIG. 3 is a timing diagram illustrating another conventional method of controlling generation of a column selection line signal in a test operation mode.
Figure 4:
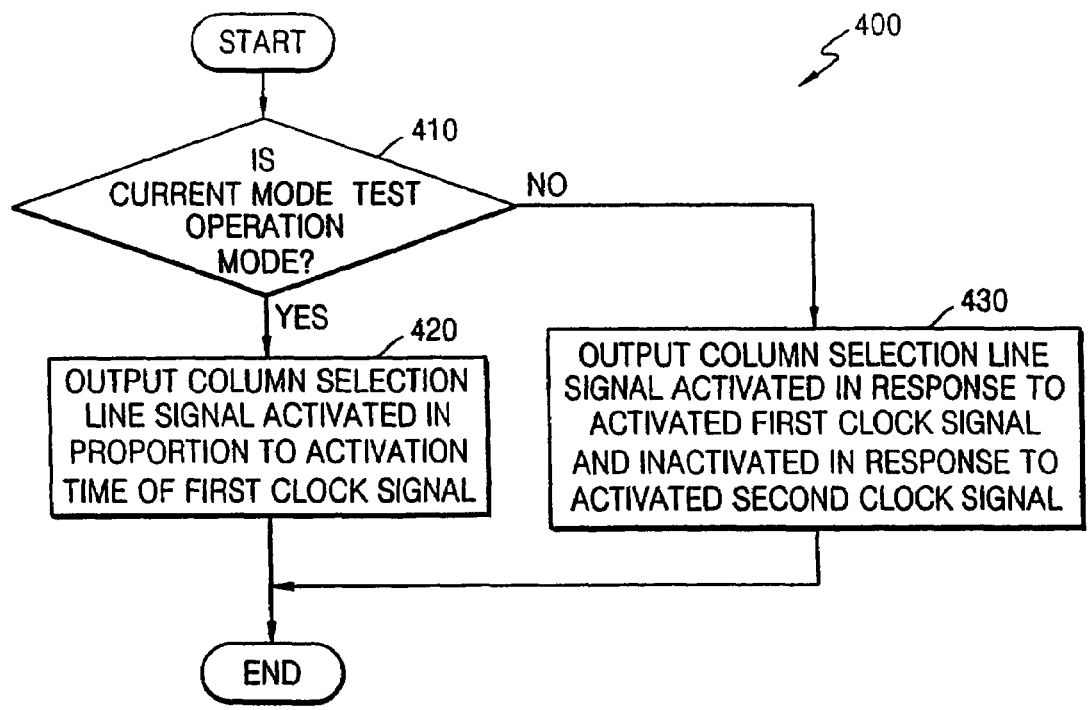
FIG. 4 is a flowchart illustrating a method of controlling generation of a column selection line signal, according to an embodiment of the present invention.

FIG. 4 is a flowchart illustrating a method 400 of controlling generation of a column selection line signal CSL according to a first exemplary embodiment of the present invention. Referring to FIG. 4, in step 410, it is determined whether a current mode is a test operation mode or a normal operation mode. If the current mode is the test operation mode, an activated test operation mode signal and first clock signal are received and a column selection line signal with an activation time proportional to an activation time of the first clock signal is generated in step 420. If the current mode is the normal operation mode, the column selection line signal, which is activated in response to the activated first clock signal and deactivated in response to an activated second clock signal, is generated in step 430.

Figure 5:
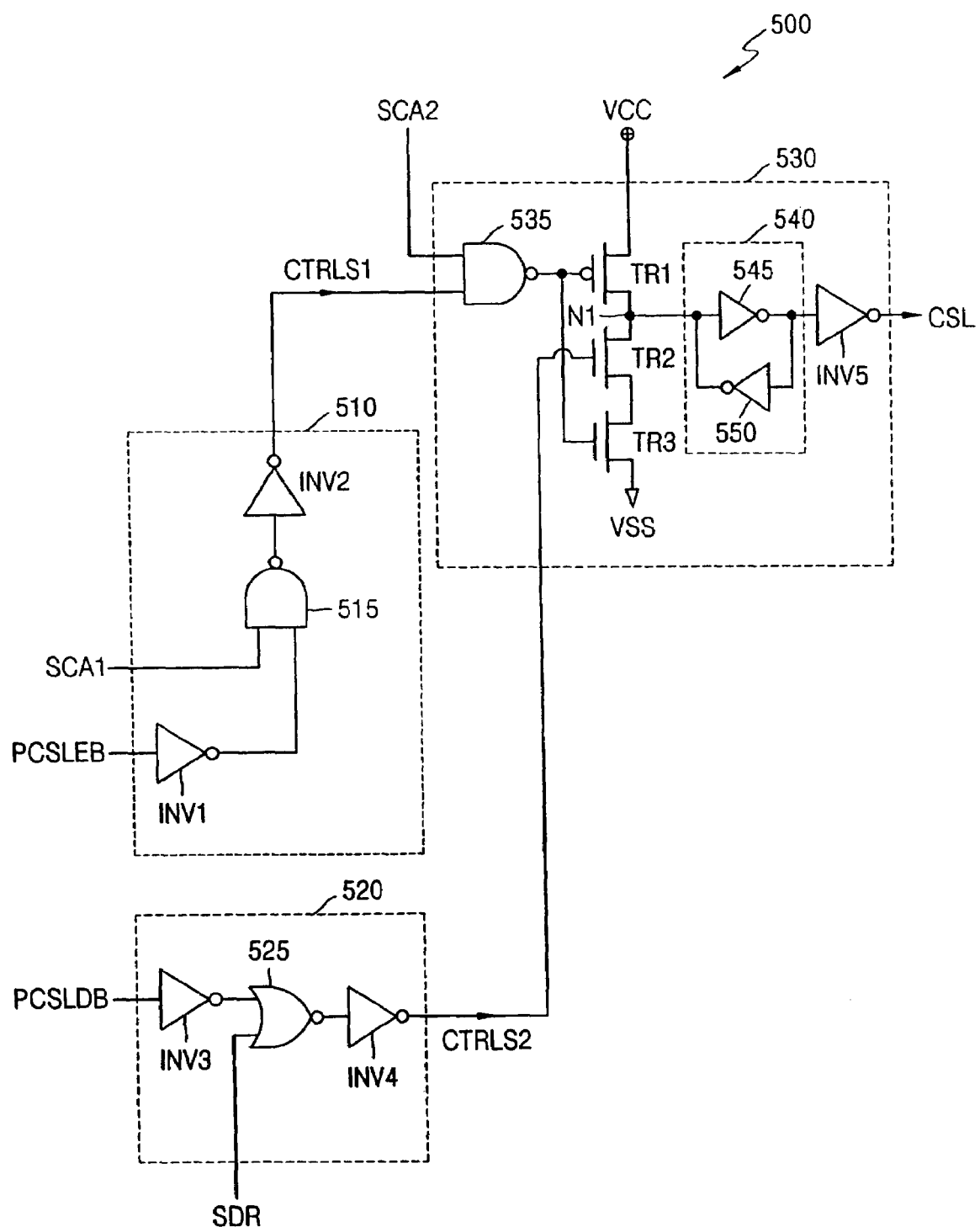
FIG. 5 is a circuit diagram of a column selection line signal control circuit, according to an embodiment of the present invention.

FIG. 5 is a circuit diagram of a column selection line signal control circuit 500 according to an exemplary embodiment of the present invention. The column selection line signal control circuit 500 includes a first controller 510, a second controller 520, and a column selection line signal generator 530.

The first controller 510 inverts a first clock signal PCSLEB and outputs a first control signal CTRLS1 as the result of inversion. The second controller 520 outputs a test operation mode signal SDR as a second control signal CTRLS2 in a test operation mode, or inverts the second clock signal PCSLDB and outputs the second control signal CTRLS2 as the result of inversion in a normal operation mode.

In a test operation mode, the column selection line signal generator 530 receives the first and second control signals CTRLS1 and CTRLS2 and outputs the column selection line signal CSL that has an activation time proportional to an activation time of the first control signal CTRLS1. In the normal operation mode, the column selection line signal generator 530 outputs the column selection line signal CSL that is activated in response to activation of the first control signal CTRLS1 and deactivated in response to deactivation of the second control signal CTRLS2.

Figure 6A:
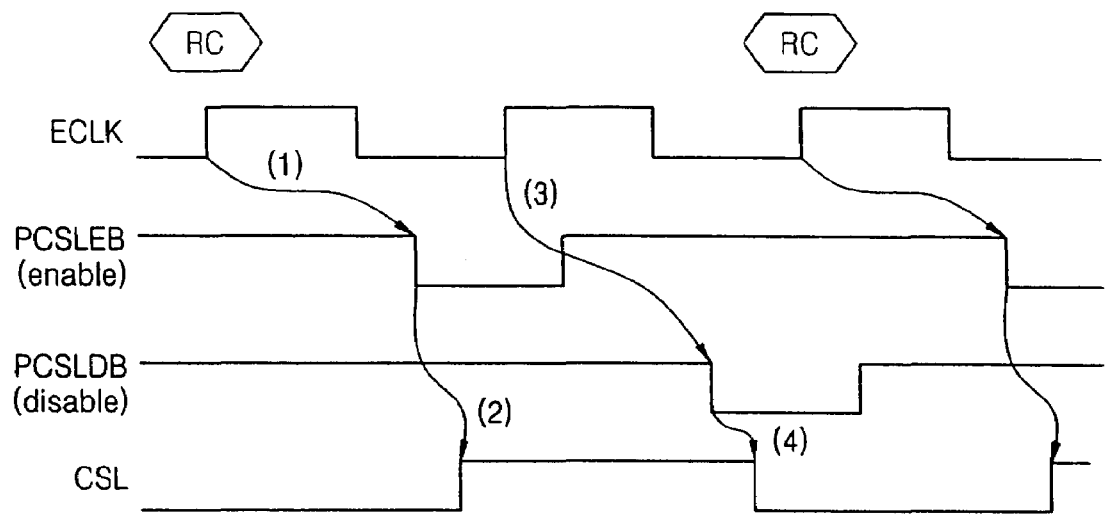
FIG. 6A is a timing diagram illustrating operation of the column selection control circuit of FIG. 5 in a normal operation mode.
Figure 6B:
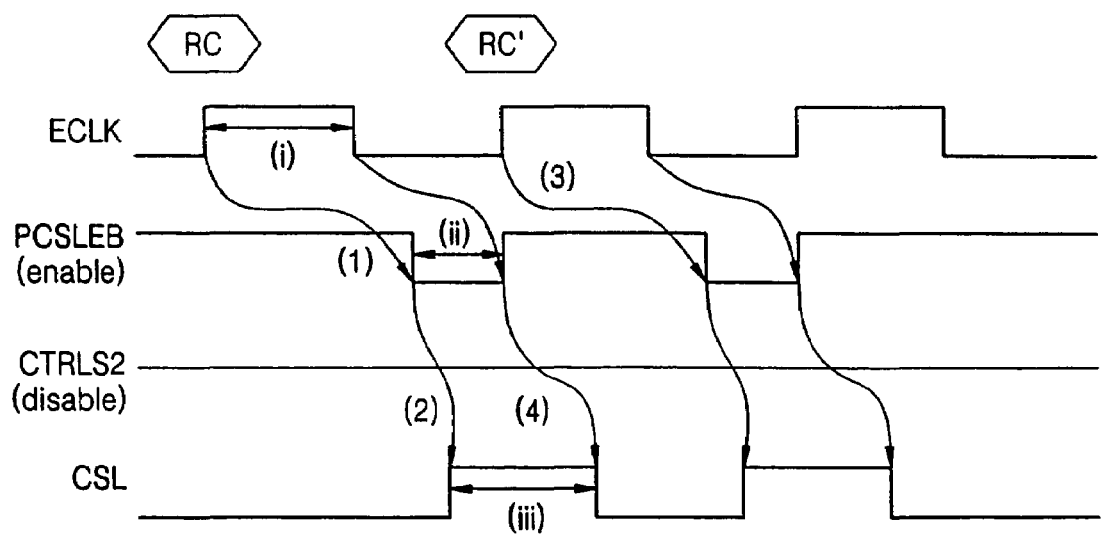
FIG. 6B is a timing diagram illustrating operation of the column selection control circuit of FIG. 5 in a test operation mode.

FIG. 6A is a timing diagram illustrating operation of the column selection line signal control circuit 500 of FIG. 5 in a normal operation mode. FIG. 6B is a timing diagram illustrating operation of the column selection line signal control circuit 500 of FIG. 5 in a test operation mode.

Hereinafter, the column selection line signal control method and the operation of the column selection line signal control circuit, according to the exemplary embodiments of the present invention, will be described with reference to FIGS. 4 through 6B.

First, it is determined whether a current mode is a test operation mode or a normal operation mode (step 410). Here, the test operation mode is an operation mode in which a command is performed for each period of an external clock signal ECLK, that is, CCD=1tCK. The normal operation mode is an operation mode where a command is performed for two periods of the external clock signal ECLK, that is, CDD=2tCK. That is, the test operation mode is a Single Data Rate (SDR) mode and the normal operation mode is a Double Data Rate (DDR) 2 mode. The external clock signal ECLK will be described below in detail.

If the current mode is the test operation mode, an activated test operation mode signal SDR and an activated first clock signal PCSLEB are received and a column selection line signal CSL, which has an activation time proportional to an activation time of the first clock signal PCSLEB, is generated (step 420).

Step 420 further includes activating the column selection line signal CSL when the first clock signal PCSLEB is activated and deactivating the column selection line signal CSL when the first clock signal PCSLEB is deactivated.

The operation of the column selection line signal control circuit 500 in the test operation mode will now be described in greater detail. The first controller 510 includes a first inverter INV1, a second inverter INV2, and a first NAND gate 515.

The first inverter INV1 inverts the first clock signal PCSLEB. The first NAND gate 515 performs a NAND operation on the output of the inverter INV1 and a first column address signal SCA1. The second inverter INV2 inverts an output of the first NAND gate 515 and outputs the first control signal CTRLS1 as the result of inversion.

The second controller 520 includes a third inverter INV3, a NOR gate 525, and a fourth inverter INV4. The third inverter INV3 inverts a second clock signal PCSLDB and outputs the result of inversion. The NOR gate 525 performs a NOR operation on the output of the third inverter INV3 and the test operation mode signal SDR.

The fourth inverter INV4 inverts an output of the NOR gate 525 and outputs the second control signal CTRLS2 as the result of inversion. The test operation mode signal SDR is activated only in the test operation mode and deactivated in the normal operation mode.

It is assumed that the test operation mode signal SDR is generated at a logic high level when the test operation mode signal SDR is activated, and is generated at a logic low level when the test operation mode signal SDR is deactivated. The reverse also works by the same principle. The test operation mode signal SDR is a Mode Register Set (MRS) signal.

Referring to FIG. 6B, the first clock signal PCSLEB is activated (1) when the external clock signal ECLK is activated, and the first clock signal PCSLEB is activated (3) when the external clock signal ECLK is deactivated. Thus, an activation time of the first clock signal is proportional to that of the external clock signal ECLK.

The external clock signal ECLK may be a system clock generated in a semiconductor memory device. The first clock signal PCSLEB is activated at a second logic level and deactivated at a first logic level.

The column selection line signal CSL is activated (2) when the first clock signal PCSLEB is activated. That is, when the first clock signal PCSLEB is generated at a logic low level, the first controller 510 outputs the first control signal CTRLS1 at a logic high level. The first column address signal SCA1 is an address signal that enables selection of a column address to which the column selection line signal CSL is input. The first column address signal SCA1 is input at a logic high level.

In the test operation mode, the test operation mode signal SDR input to the second controller 520 is at a logic high level and the second control signal CTRLS2 is output at a high logic level regardless of the level of the second clock signal PCSLDB.

The column selection line signal generator 530 includes a second NAND gate 535, first through third transistors TR1, TR2, and TR3, a latch 540 comprising: inverters 545 and 550, and a fifth inverter INV5.

The second NAND gate 535 performs a NAND operation on a second column address signal SCA2 and the first control signal CTRLS1. A power source voltage VCC is input to a first terminal of the first transistor TR1, an output of the second NAND gate 535 is input to a gate of the first transistor TR1, and a second terminal of the first transistor TR1 is connected to a first node N1.

A first terminal of the second transistor TR2 is connected to the first node N1 and the second control signal CTRLS2 is input to a gate of the second transistor TR2. A first terminal of the third transistor TR3 is connected to a second terminal of the second transistor TR2, the output of the second NAND gate 535 is input to a gate of the third transistor TR3, and a second terminal of the third transistor TR3 is connected to a ground voltage VSS.

The latch 540 receives and latches a logic value from the first node N1. The fifth inverter INV5 inverts an output of the latch 540 and outputs the column selection line signal CSL as the result of inversion.

The second control signal CTRLS2, which is generated at a logic high level in the test operation mode, turns on the second transistor TR2. During the test operation mode, the logic high level of the second control signal CTRLS2 is maintained, and thus, the second transistor TR2 remains on.

The second column address signal SCA2 is an address signals that enables selection of a column address to which the column selection line signal CSL is input, and is received at a logic high level. Since both the second column address signal SCA2 and the first control signal CTRLS1 are at a logic high level, the output of the second NAND gate 535 is at a logic low level.

Accordingly, the first transistor TR1 is turned on and the third transistor TR3 is turned off. When the first transistor TR1 is turned on, input of the power source voltage VCC causes a voltage level at the first node N1 to be a logic high level and the column selection line signal CSL is activated at a logic high level by the latch 540 and the fifth inverter INV5 (see FIG. 6B (2)).

The first clock signal PCSLEB is deactivated at a falling edge of the external clock signal ECLK. That is, the first clock signal PCSLEB transitions to a logic high level (see FIG. 6B (3)). As a result, the first control signal transitions to a logic low level. In the test operation mode, the second control signal CTRLS2 is maintained at a logic high level.

Accordingly, the output of the second NAND gate 535 is generated at a logic high level, the first transistor TR1 is turned off, and the third transistor TR3 is turned on. In this case, input of the ground voltage VSS causes a voltage level of the first node N1 to be a logic low level and the column selection line signal CSL is also deactivated at a logic low level by the latch 540 and the fifth inverter INV5 (see FIG. 6B (4)).

In the test operation mode, since the second control signal CTRLS2 is continuously generated at a logic high level, the second transistor TR2 remains on and the column selection line signal. CSL is activated or deactivated depending on the logic level of the first clock signal PCSLEB.

In FIG. 6B, the activation time (iii) of the column selection line signal CSL is proportional to the activation time (ii) of the first clock signal PCSLEB and the activation time (ii) of the first clock signal PCSLEB is proportional to the activation time (i) of the external clock signal ECLK. Therefore, the activation time (iii) of the column selection line signal CSL is proportional to the activation time (i) of the external clock signal ECLK.

If the current mode is the normal operation mode, the column selection line signal is activated in response to the activated first clock signal PCSLEB and deactivated in response to the activated second clock signal PCSLDB (step 430).

The normal operation mode is a mode where a command is performed for two periods of the external clock signal ECLK. That is, CCD=2tCK.

Referring to FIG. 6A, the first clock signal PCSLEB is activated (1) at a logic low level in response to a rising edge of the external clock signal ECLK. In this case, a first control signal CTRLS1 is generated at a logic high level. In the normal operation mode, a test operation mode signal SDR is generated at a logic low level. Since the second clock signal PCSLDB is generated at a logic high level, the second control signal CTRLS2 is generated at a logic low level.

Since the first control signal CTRL1 is at a logic high level and the second control signal CTRLS2 is at a logic low level, the first transistor TR1 is turned on and the second and third transistors TR2 and TR3 are turned off. As a result, a column selection line signal CSL is activated at a logic high level (see FIG. 6A (2)).

Next, the second clock signal PCSLDB is activated at a logic low level at a subsequent rising edge of the external clock signal ECLK (see FIG. 6A (3)). In this case, the first clock signal PCSLEB is deactivated at a logic high level. Therefore, the first control signal CTRLS1 is generated at a logic low level and the second control signal CTRLS2 is generated at a logic high level.

Then, the first transistor TR1 is turned off and the second and third transistors TR2 and TR3 are turned on. Therefore, the column selection line signal CSL is deactivated at a logic low level (see FIG. 6A (4)).

In the normal operation mode, activation of the first clock signal PCSLEB causes activation of the column selection line signal CSL and activation of the second clock signal PCSLDB causes deactivation of the column selection line signal CSL.

However, in the test operation mode, the column selection line signal CSL is activated only when the first clock signal PCSLEB is activated. That is, the column selection line signal control circuit 500 operates according to a latch-type Column Selection Line (CSL) method in the normal operation mode, and operates according to a static-type CSL method in the test operation mode. Accordingly, the column selection line signal control circuit 500 enables selection of the column selection line signal CSL depends on a type of operation mode without an additional logic circuit.

As described above, a method and circuit for controlling generation of a column selection line signal, according to exemplary embodiments of the present invention are capable of controlling generation of a column selection line signal depending on a type of operation mode without an increase in circuit logic. Accordingly, it is possible to effectively realize CCD=1tCK in a semiconductor memory device, which operates in the DDR2 mode, in a test operation mode.

While the present invention has been particularly shown and described with reference to exemplary embodiments thereof, it will be understood by those of ordinary skill in the art that various changes in form and details may be made therein without departing from the spirit and scope of the invention as defined by the appended claims.

What is claimed is:

1. A method of controlling a column selection line signal, the method comprising:
   determining whether a current mode is a normal operation mode or a test operation mode;
   receiving an activated test operation mode signal and an activated first clock signal and outputting a column selection line signal with an activation time proportional to an activation time of the first clock signal, when the current mode is the test operation mode; and
   outputting the column selection line signal that is activated in response to the activated first clock signal and is deactivated in response to an activated second clock signal, when the current mode is the normal operation mode.

2. The method of claim 1, wherein outputting the column selection line signal with an activation time proportional to the activation time of the first clock signal comprises:
   activating the column selection line signal when the first clock signal is activated; and
   deactivating the column selection line signal when the first clock signal is deactivated.

3. The method of claim 1, wherein the activation time of the first clock signal is proportional to an activation time of an external clock signal.

4. The method of claim 3, wherein the first clock signal is activated in response to activation of the external clock signal and deactivated in response to deactivation of the external clock signal.

5. The method of claim 3, wherein a command is performed for one period of the external clock signal in the test operation mode.

6. The method of claim 1, wherein the test operation mode signal is activated in the test operation mode and deactivated in the normal operation mode.

7. The method of claim 1, wherein the test operation mode signal is a mode register set signal.

8. The method of claim 1, wherein the second clock signal is activated in response to the activation of the external clock signal and deactivated in response to the activation of the subsequent external clock signal.

9. The method of claim 1, wherein a command is performed for two periods of the external clock signal in the normal operation mode.

10. A column selection line signal control circuit comprising:
    a first controller that inverts a first clock signal and outputs a first control signal as a result of inversion of the first clock signal;
    a second controller that outputs a test operation mode signal as a second control signal in a test operation mode, and inverts a second clock signal and outputs the second control signal as a result of inversion of the second clock signal in a normal operation mode; and
    a column selection line signal generator that receives the first and second control signals and outputs a column selection line signal, which, in the test operation mode, has an activation time proportional to activation time of the first control signal, and, in the normal operation mode, is activated in response to activation of the first control signal and deactivated in response to activation of the second control signal.

11. The column selection line signal control circuit of claim 10, wherein the activation time of the first clock signal is proportional to an activation time of the external clock signal.

12. The column selection line signal control circuit of claim 11, wherein the first clock signal is activated in response to activation of the external clock signal and deactivated in response to deactivation of the external clock signal.

13. The column selection line signal control circuit of claim 12, wherein a command is performed for one period of the external clock signal in the test operation mode.

14. The column selection line signal control circuit of claim 10, wherein the first controller comprises:
    a first inverter that inverts the first clock signal;
    a first NAND gate that performs a NAND operation on an output of the first inverter and a first column address signal; and
    a second inverter that inverts an output of the first NAND gate and outputs the first control signal as a result of inversion of the output of the first NAND gate.

15. The column selection line signal control circuit of claim 14, wherein the first clock signal is activated at a second logic level and deactivated at a first logic level.

16. The column selection line signal control circuit of claim 10, wherein the test operation mode signal is activated in the test operation mode and deactivated in the normal operation mode.

17. The column selection line signal control circuit of claim 10, wherein the test operation mode signal is a mode register set signal.

18. The column selection line signal control circuit of claim 10, wherein the second clock signal is activated in response to the activation of the external clock signal and deactivated in response to the activation of the subsequent external clock signal.

19. The column selection line signal control circuit of claim 18, wherein a command is performed for two periods of the external clock signal in the normal operation mode.

20. The column selection line signal control circuit of claim 18, wherein the second clock signal is activated at a second logic level and deactivated at a first logic level.

21. The column selection line signal control circuit of claim 10, wherein the second controller comprises:
    a third inverter that inverts the second clock signal and outputs as a result of inversion of the second clock signal;
    a NOR gate that performs a NOR operation on an output of the third inverter and the test operation mode signal; and a fourth inverter that inverts an output of the NOR gate and outputs the second control signal as a result of inversion of the output of the NOR gate.

22. The column selection line signal control circuit of claim 10, wherein the column selection line signal generator comprises:

a second NAND gate that performs a NAND operation on a second column address signal and the second control signal;

a first transistor having a first terminal connected to a power source voltage, a gate to which an output of the second NAND gate is input, and a second terminal connected to a first node;

a second transistor having a first terminal connected to the first node and a gate to which the second control signal is input;

a third transistor having a first terminal connected to the second terminal of the second transistor, a gate to which the output of the second NAND gate is input, and a second terminal connected to a ground voltage;

a latch that receives and latches a logic value from the first node; and a fifth inverter that inverts an output of the latch and outputs the column selection line signal as a result of inversion of the output of the latch.

* * * * *